United States Patent

Kikuchi et al.

[11] Patent Number: 5,603,446
[45] Date of Patent: Feb. 18, 1997

[54] BONDING APPARATUS

[75] Inventors: Eiji Kikuchi, Musashi Murayama; Tsuneharu Arai, Fussa, both of Japan

[73] Assignee: Kabushiki Kaisha Shinkawa, Tokyo, Japan

[21] Appl. No.: 679,904

[22] Filed: Jul. 10, 1996

[30] Foreign Application Priority Data

Jul. 13, 1995 [JP] Japan .................................. 7-199310

[51] Int. Cl.$^6$ .................................................. H01L 21/603
[52] U.S. Cl. ........................ 228/6.2; 228/44.7; 228/56.5
[58] Field of Search .................................... 228/6.2, 44.7, 228/56.5, 103, 180.22, 5.5; 437/220

[56] References Cited

U.S. PATENT DOCUMENTS

| | | | |
|---|---|---|---|
| 3,949,925 | 4/1976 | Keizer et al. | 228/5.5 |
| 3,957,185 | 5/1976 | Kauffman et al. | 228/6.2 |
| 4,940,217 | 7/1990 | Takeshita | 269/50 |
| 5,205,460 | 4/1993 | Sato et al. | 228/44.7 |
| 5,372,292 | 12/1994 | Sato et al. | 228/44.7 |

FOREIGN PATENT DOCUMENTS 5-259219  10/1993  Japan .

*Primary Examiner*—Samuel M. Heinrich
*Attorney, Agent, or Firm*—Koda and Androlia

[57] ABSTRACT

A bonding apparatus which includes a function of adjusting the height level of an upper limit of a bonding stage including a standard stroke cam which raises and lowers the bonding stage, a cam holder which rotatably supports one end of the standard stroke cam and moves in a horizontal direction, a standard stroke air cylinder which drives the cam holder in a horizontal direction, a roller which is installed on the standard stroke cam, a linear cam which is contacted by the roller of the standard stroke cam, and a motor used for moving the linear cam so that the position of contact with the roller of the standard stroke cam can be changed when the raised position of the bonding stage is adjusted.

2 Claims, 2 Drawing Sheets

BONDING APPARATUS

BACKGROUND OF THE INVENTION

1. Field of the Invention

The present invention relates to a bonding apparatus which bonds semiconductor pellets to leads of lead frames or leads installed on a film carrier, and more particularly, to a device for adjusting the raised position of the bonding stage of the bonding apparatus.

2. Prior Art

For example, the apparatus disclosed in Japanese Patent Application Laid-Open (Kokai) No. 5-259219 is known as a bonding apparatus which bonds semiconductor pellets to leads installed on a film carrier.

In this type of bonding apparatus, it is necessary to change the raised position of the bonding stage (on which the semiconductor pellets are carried) in order to adjust the clearance between the semiconductor pellets and the leads (which are bonded) in cases where the type of product to be handled is changed. The adjustment device which is used to adjust the raised position of the bonding stage includes: an adjustment means, which adjusts the relative amount of vertical movement of the bonding stage with respect to the raising-and-lowering drive means that raises and lowers the bonding stage, and a detection means, which detects the amount by which the bonding stage is moved up and down by the adjustment means.

With the bonding stage set at a raised position, the bonding stage is pushed up by the adjustment means so that the bumps on the semiconductor pellet are caused to contact the leads, and the detected value obtained by the detection means in this state is taken as a standard value. Then, with the leads being contacted BY the bumps, the bonding stage is lowered by the adjustment means so that the detected value obtained by the detection means becomes a prescribed value relative to the standard value. The clearance between the leads and the bumps on the semiconductor pellet is thus adjusted to a prescribed amount.

Accordingly, in the prior art described above, two operations are required: one for rasing the bonding stage by manually operating the adjustment means so that the bumps on the semiconductor pellet are brought to contact the leads, the other for lowering the bonding stage by operating the adjustment means so that the detected value obtained by the detection means becomes a prescribed value. Furthermore, these operations must be performed each time there is a change in the type of product to be handled.

Accordingly, it is impossible to respond quickly to changes in the type of product to be handled. Furthermore, since observation of the conditions of contact of the bumps on the semiconductor pellet with the leads is accomplished by visual inspection, and since this operation is performed each time when the type of product to be handled is changed, some unexpected differences may occur in the adjustment as a result of individual differences of the workers. As a result, consistent quality bonding is not accomplished.

SUMMARY OF THE INVENTION

Accordingly, the object of the present invention is to provide a bonding apparatus in which the raised position of the bonding stage can be adjusted quickly, and in which a constant adjustment can always be accomplished.

The objects are accomplished by a unique structure by the present invention for a bonding apparatus which includes a bonding stage that carries semiconductor pellets thereon and is raised and lowered and which causes a pressure bonding of leads of lead frames or leads installed on a film carrier to bumps of the semiconductor pellets, and the unique structure is that the bonding apparatus is equipped with: a standard stroke cam which raises and lowers the bonding stage, a cam holder which rotatably supports one end of the standard stroke cam and is installed so as to be movable in a horizontal direction, a standard stroke driving means which drives the cam holder in a horizontal direction, a roller which is installed on the other end of the standard stroke cam, a linear cam which is contacted by the roller and used for an upper limit variation, and a motor which moves the linear cam so that the position of contact with the roller is altered during the adjustment of the raised position of the bonding stage.

DETAILED DESCRIPTION OF THE PREFERRED EMBODIMENTS

Figure 1:
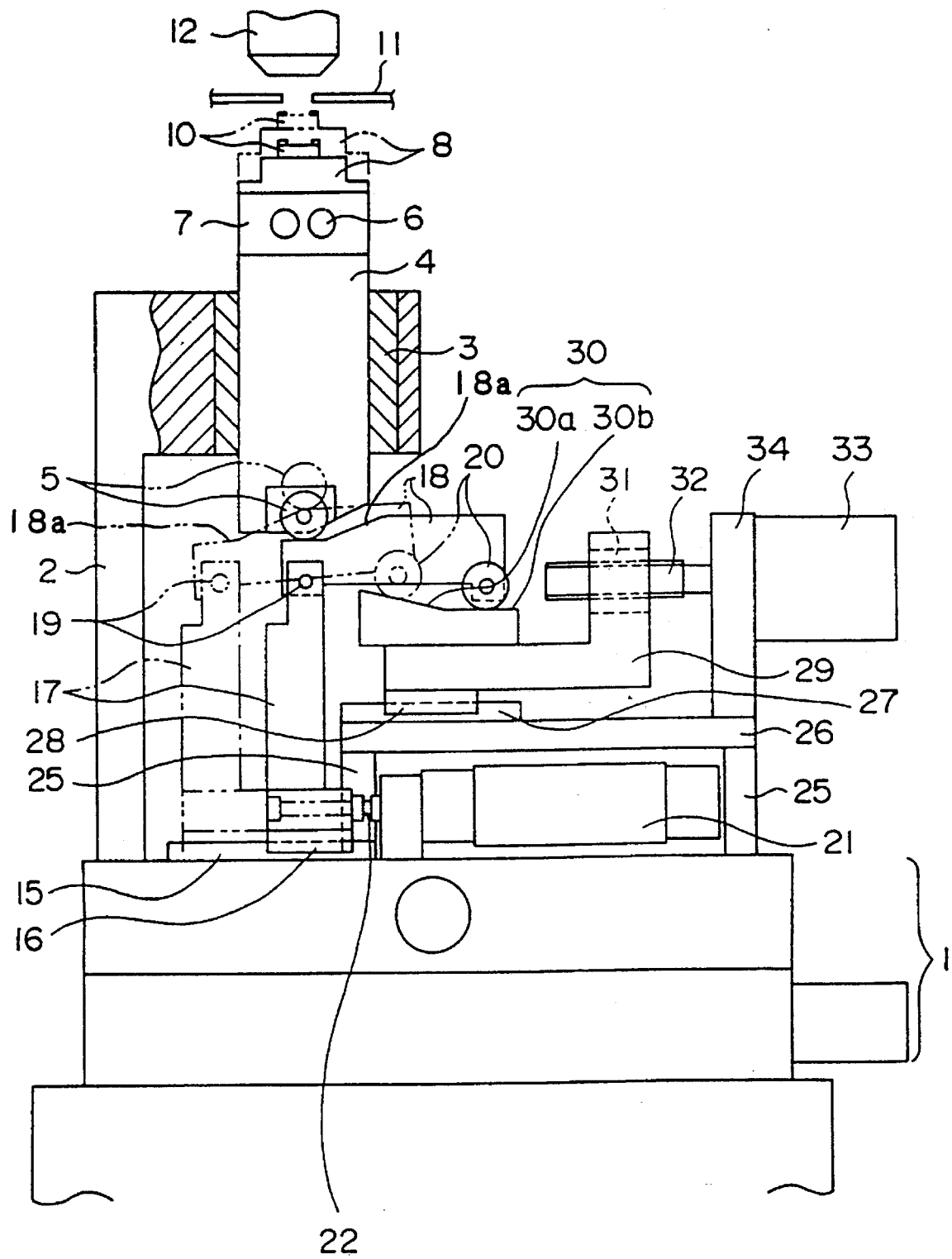
FIG. 1 is a partially sectional front view of one embodiment of the bonding apparatus of the present invention.

A supporting block 2 is fastened to the surface of an XY table 1 which has a universally known structure and is driven in the X and Y (horizontal) directions by a driving means which is not shown in FIG. 1.

A raising-and-lowering block 4 is installed in the supporting block 2 with a slide bearing 3 in between so that the raising-and-lowering block 4 is movable up and down. A roller 5 is rotatably installed at the lower end of the raising-and-lowering block 4. A heating block 7 to which a heater 6 is installed in a detachable manner is fastened to the raising-and-lowering block 4, and a bonding stage 8 is provided on the heating block 7. Suction attachment holes (not shown) which hold a semiconductor pellet 10 in place by vacuum suction are formed in the heating block 7 and in the bonding stage 8 in the same manner as in a conventional device.

A guide rail 15 is provided on the XY table 1 so as to be located beneath the roller 5, and a guide block 16 is fitted over the guide rail 15 so that the guide block 16 is slidable on the rail 15.

A cam holder 17 which extends upward is fastened to the guide block 16, and one end (left end in FIG. 1) of a standard stroke cam 18 which has a tilted cam surface 18a on its upper surface is coupled to the cam holder 17 via a supporting shaft 19 so that the standard stroke cam 18 is rotatable about the shaft 19. The cam surface 18a of the standard stroke cam 18 is in contact with the roller 5, and a roller 20 is attached on the other end (right end in FIG. 1) of the standard stroke cam 18 in a rotatable fashion.

A standard stroke air cylinder 21 is provided on the XY table so that the air cylinder 21 faces the cam holder 17. The operating rod of the standard stroke air cylinder 21 is connected to the cam holder 17.

A supporting plate 26 is fastened to the XY table 1 via supporting legs 25, and a guide rail 27 is provided on the supporting plate 26. A guide block 28 is fitted over the guide rail 27 so that the guide block 28 can slide on the rail 27, and a cam holder 29 is fastened to the guide block 28.

A linear cam 30 which is used to vary the upper limit of the bonding stage 8, and which has a tilted cam surface 30a and a horizontal cam surface 30a on its upper surface, is mounted on the cam holder 29 so that the linear cam 30 contacts the roller 20 of the standard stroke cam 18. An inner thread screw 31 is fastened to the upright portion of the cam holder 29, and a screw shaft 32 is engaged with the inner thread screw 31.

The output shaft of a motor 33 which is used to vary the upper limit of the bonding stage 8 is connected to the screw shaft 32. The upper limit varying motor 33 is mounted on the supporting plate 26 via a motor supporting plate 34.

The bonding operation will be described below with reference to FIG. 1.

When the bonding stage 8 is lowered which is indicated by the solid lines in FIG. 1, a semiconductor pellet 10 is placed on the bonding stage 8 by a conveying means (not shown), and the semiconductor pellet 10 is held on the bonding stage 8 by vacuum suction applied from the suction attachment holes formed in the bonding stage 8.

Next, the XY table 1 is driven in the X and Y directions, so that a necessary correction of the position of the semiconductor pellet 10 in the X and Y directions with respect to the leads 11 is made.

Then, the standard stroke air cylinder 21 is actuated so that the operating rod 22 of the cylinder 21 protrudes. As a result, the guide block 16 and cam holder 17 are moved along the guide rail 15, and the cam holder 17 and standard stroke cam 18 assume the positions that are indicated by the two-dot chain lines. In other words, the bonding stage 8 is raised by the sam surface 18a of the cam 18 so that the bonding can be performed to the pellet 10.

Figure 2:
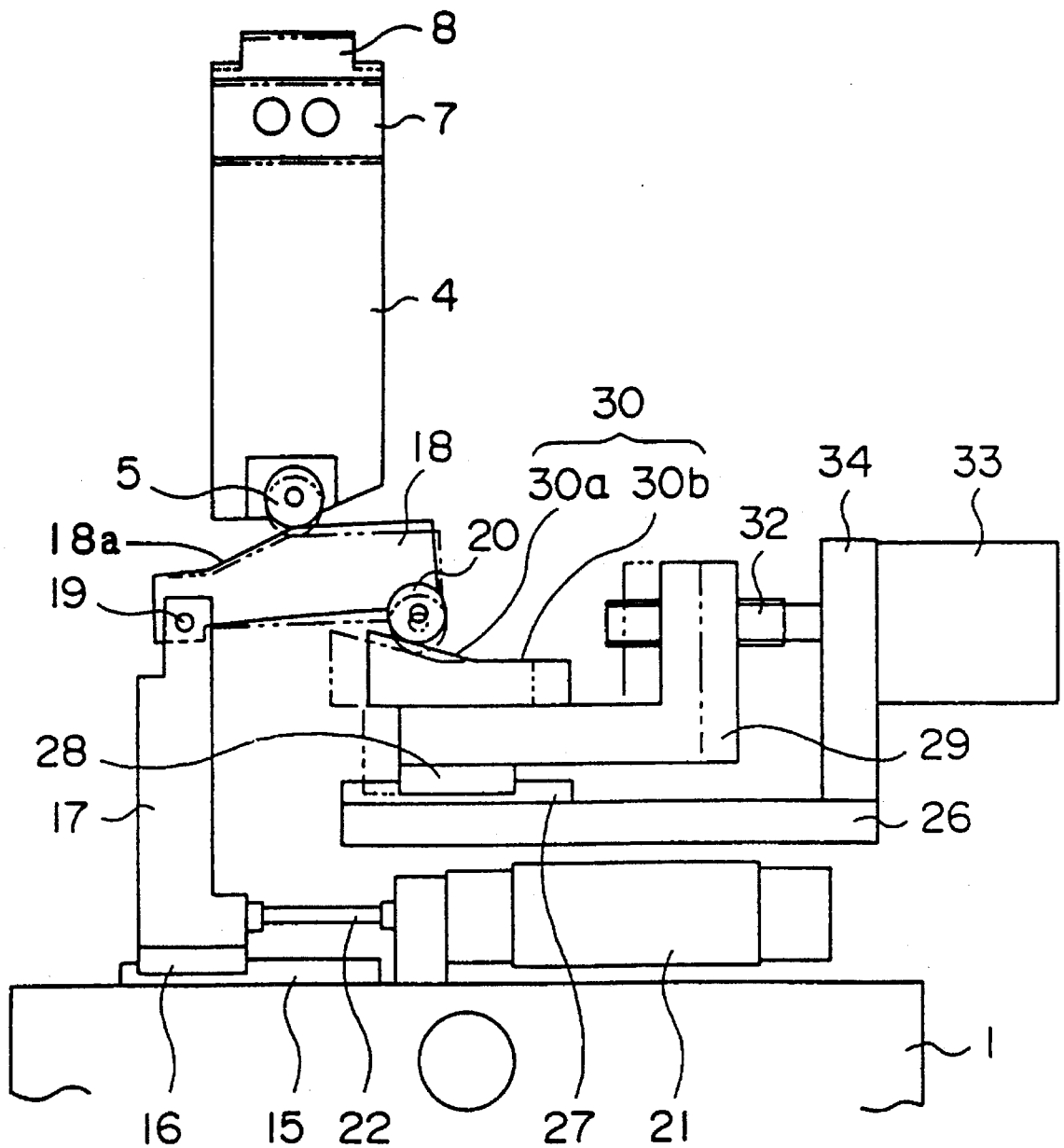
FIG. 2 is a front view showing the bonding stage of the bonding apparatus in a raised position.

In this case, the roller 20 of the standard stroke cam 18 is moved along the tilted cam surface 30a of the upper limit varying linear cam 30 and is pushed upward by the tilted cam surface 30a of the upper limit varying linear cam 30; accordingly, the standard stroke cam 18 tilts slightly in the counterclockwise direction about the supporting shaft 19, thus assuming the position indicated by the two-dot chain line in FIG. 2.

When the standard stroke cam 18 is thus moved as indicated by the two-dot chain line, the roller 5, raising-and-lowering block 4, heating block 7 and bonding stage 8 are pushed upward by the cam surface 18a of the standard stroke cam 18, so that the bonding stage 8 is raised and assumes the position indicated by the two-dot chain line.

After this, the bonding tool 12 is lowered so that the leads 11 are bonded to the bumps on the semiconductor pellet 10; and afterward, the bonding tool 12 is raised, and the standard stroke air cylinder 21 is actuated in the opposite direction from that described above, so that the bonding stage 8 is lowered to the position indicated by the solid line.

Next, the adjustment of the raised position of the bonding stage 8 will be described below with reference to FIG. 2. Such an adjustment is made when there is a change in the type of product to be handled so that the clearance between the leads 11 and the bumps of the semiconductor pellet 10 is changed.

In particular, the solid lines in FIG. 2 show the bonding stage 8 in its raised position, and this corresponds to the state indicated by the two-dot chain lines in FIG. 1.

When the upper limit varying motor 33 is actuated, the screw shaft 32 is rotated; as a result, the guide block 28 and cam holder 29 are moved along the guide rail 27 (to the left in FIG. 2), so that the cam holder 29 and upper limit varying linear cam 30 assume the positions indicated by the two-dot chain lines. As a result, the height of the horizontal cam surface 30b of the upper limit varying linear cam 30 which is in contact with the roller 20 becomes lower, so that the roller 20 descends on the horizontal cam surface 30b of the cam 30. Accordingly, the standard stroke cam 18 pivots in the clockwise direction about the supporting shaft 19 and assumes the position that is indicated by the two-dot chain line. When the standard stroke cam 18 assumes the position indicated by the two-dot chain line, the cam surface of the standard stroke cam 18 contacted by the roller 5 also becomes lower; accordingly, the roller 5 and bonding stage 8 are lowered so that the bonding stage 8 assumes the position indicated by the two-dot chain line.

Conversely, when the upper limit varying motor 33 is actuated to rotate in the opposite direction from that described above while the upper limit varying linear cam 30 is positioned at the height indicated by the solid line, the upper limit varying linear cam 30 is moved to the right (in FIG. 2) from the position indicated by the solid line as a result of the same action as that described above, thus the roller 20 is pushed upward. As a result, the standard stroke cam 18 pivots in the counterclockwise direction from the position indicated by the solid line about the supporting shaft 19, so that the roller 5 is pushed upward by the cam surface 18a of the standard stroke cam 18. Accordingly, the bonding stage 8 is raised to a position which is higher than the position indicated by the solid line.

As seen from the above, when the position of the upper limit varying linear cam 30 is changed by the upper limit varying motor 33, the position of the bonding stage 8 is, as a result, changed. In particular, if the standard stroke cam 30 is moved in one direction by the motor 33, the position at which the roller 20 of the standard stroke cam 18 contacts the tilted cam surface 30a of the upper limit varying linear cam 30 changes, and the standard stroke cam 18 pivots according to the height of the tilted cam surface 30a of the upper limit varying linear cam 30. Thus, the cam surface of the standard stroke cam 18 contacting the roller 5 changes, changing the position (or the height) of the bonding stage 8 up and down.

Accordingly, the raised position of the bonding stage 8 can be adjusted to meet the type of product to be bonded by causing the upper limit varying motor 33 to rotate. This adjustment of the raised position of the bonding stage 8 is performed only when there is a change in the type of product to be handled, and there is no need to perform this adjustment during the bonding operation. In other words, the raised position of the bonding stage 8 can be arbitrarily adjusted by actuating the upper limit varying motor 33; accordingly, by determining rotation positions of the upper limit varying motor 33, i.e., positions of the upper limit varying linear cam 30, that correspond to various types of products in advance, and inputting the information of these positions into a control circuit of the upper limit varying motor 33, it is possible to cause automatic rotation of the upper limit varying motor 33 so as to comply with the type of product to be handled when there is a change in the product type, merely by pressing a button that corresponds to the product type to be bonded. In other words, the raised position of the bonding stage can be adjusted quickly and automatically. In addition, since it is necessary to determine each raised position of the bonding stage only once, there is no need to perform the height adjustment work each time there is a change in the type of product to be handled. Thus, a consistent adjustment can be made, and the bonding quality becomes stable.

In the embodiment described above, the cam holder 17 is driven by the standard stroke air cylinder 21. However, it is possible to drive the cam holder 17 by a motor.

As seen from the above, according to the present invention, the vertical position of the bonding stage can be adjusted by: a standard stroke cam which raises and lowers the bonding stage, a cam holder which is movable in the horizontal direction and connected to one end of the standard stroke cam so that the cam is tiltable, a standard stroke driving means which drives the cam holder in a horizontal direction, a standard stroke driving means which drives the cam holder in a horizontal direction, a roller installed on the other end of the standard stroke cam, a linear cam in contact with the roller so as to be used for upper limit variation, and a motor which moves the linear cam so that the position of contact of the linear cam with the roller can be changed. Accordingly, the raised position of the bonding stage can be changed and secured quickly, and a constant adjustment can always be obtained.

We claim:

1. A bonding apparatus which has a bonding stage that carries semiconductor pellets and is installed so as to be raised and lowered and causes a pressure bonding of leads of lead frames or leads of a film carrier to bumps of a semiconductor pellet, said bonding apparatus being characterized in that said apparatus further comprises:

a standard stroke cam which raises and lowers said bonding stage;

a cam holder which supports one end of said standard stroke cam so that said cam is free to rotate, said cam holder being movable in a horizontal direction;

a standard stroke driving means which drives said cam holder in a horizontal direction;

a roller which is installed on another end of said standard stroke cam;

a linear cam used for upper limit variation, which is contacted by said roller; and a motor used for upper limit variation which moves said linear cam used for upper limit variation so that a position of contact with said roller is altered when a raised position of the bonding stage is adjusted.

2. A bonding apparatus including a bonding stage provided on one end of a vertically movable block so that a bonding is carried out on said bonding stage when said bonding vertically movable block is moved upward, said bonding apparatus further comprising:

a first roller provided at another end of said vertically movable block;

a first cam having a tilted cam surface thereon which is in contact with said first roller of said vertically movable block, said first cam having a tilting shaft at one end thereof and a roller shaft at another end thereof, said roller shaft being provided with a second roller thereon;

a first cam holder connected via said tilting shaft of said first cam so that said first cam is tiltable about said first cam shaft;

a horizontal movement driving means which moves said first cam holder in a horizontal direction;

a second cam having a tilted cam surface thereon so that said tilted cam surface is in contact with said second roller of said first cam;

a second cam holder mounting thereon said second cam; and a vertical movement driving means connected to said second cam holder so as to move said second cam holder in a horizontal direction that causes a vertical movement of said vertically movable block via said second cam, said first cam and said first roller.

* * * * *